United States Patent [19]

Dobbs et al.

[11] Patent Number: 4,690,693

[45] Date of Patent: Sep. 1, 1987

[54] HIGH PURITY SILICON NITRIDE POLISHING COMPOUND

[75] Inventors: Robert J. Dobbs, Monroeton, Pa.; Shuford M. Alexander, Jr., Dallas, Tex.

[73] Assignee: GTE Products Corporation, Stamford, Conn.

[21] Appl. No.: 804,724

[22] Filed: Dec. 5, 1985

[51] Int. Cl.[4] ............................................. C04B 35/64
[52] U.S. Cl. ........................................ 51/307; 51/308; 428/331; 428/700; 428/698
[58] Field of Search ................... 51/307, 308; 428/331, 428/446, 700, 698, 699, 704

[56] References Cited

U.S. PATENT DOCUMENTS

| | | | |
|---|---|---|---|
| 3,269,815 | 8/1966 | Koopman | 51/308 |
| 4,055,451 | 10/1977 | Cockbain et al. | 428/698 X |
| 4,264,550 | 4/1981 | Ezis | 51/307 X |
| 4,280,973 | 7/1981 | Moskowitz et al. | 51/307 X |
| 4,304,576 | 12/1981 | Hattori et al. | 51/308 X |
| 4,323,325 | 4/1982 | Samanta et al. | 51/308 X |
| 4,406,667 | 9/1983 | Sarin et al. | 51/308 X |
| 4,557,244 | 12/1985 | Allor | 51/308 X |

*Primary Examiner*—Nancy A. Swisher
*Attorney, Agent, or Firm*—Donald R. Castle; L. Rita Quatrini

[57] ABSTRACT

A polishing compound is disclosed which is relatively high purity silicon nitride, the silicon nitride comprising particles having equiaxial crystals, the particle size being from about 0.03 to about 5 microns.

4 Claims, No Drawings

HIGH PURITY SILICON NITRIDE POLISHING COMPOUND

BACKGROUND OF THE INVENTION

This invention relates to a high purity polishing compound of silicon nitride.

In the processing of semiconductor materials and other materials aluminum oxide is currently used as a polishing agent. However, aluminum oxide dopes the materials and thus contaminates them.

It is desirable, therefore, to produce a material which is sufficiently hard and yet pure enough to be an effective polishing agent which would not contaminate the material.

SUMMARY OF THE INVENTION

In accordance with one aspect of this invention there is provided a polishing compound of relatively high purity silicon nitride, the silicon nitride comprising particles having equiaxial crystals, the particle size being from about 0.03 microns to about 5 microns.

DETAILED DESCRIPTION OF THE INVENTION

For a better understanding of the present invention, together with other and further objects, advantages, and capabilities thereof, reference is made to the following disclosure and appended claims in connection with the above description of some of the aspects of the invention.

The polishing compound of this invention is relatively high purity silicon nitride. The silicon nitride comprises particles having equiaxial crystals, the particle size being generally from about 0.03 microns to about 5 microns. The silicon nitride has a purity of at least about 94%.

It is preferred that at least a portion of the silicon nitride be alpha silicon nitride as opposed to beta silicon nitride because it is harder than the latter. It is especialy preferred that the silicon nitride be essentially all alpha silicon nitride.

High purity silicon nitride is known. A preferred silicon nitride which consists essentially of from about 92% to about 98% alpha silicon nitride of the above purity is manufactured by the Chemical and Metallurgical Division of GTE Products Corporation under the trade name of SN 502.

Silicon nitride is made of particles which are essentially needle like crystals. The silicon nitride is milled to shorten the needles to produce crystals which are essentially equiaxial.

The milling is done generally by standard methods.

The resulting milled silicon nitride is then processed to produce particles in the desired particle size range within the above given range depending on the particular application.

By virtue of the natural hardness of silicon nitride and its purity, the silicon nitride can be used as a polishing compound for material such as semiconductor material such as semiconductor wafers without contaminating the material.

While there has been shown and described what are at present considered the preferred embodiments of the invention, it will be obvious to those skilled in the art that various changes and modifications may be made therein without departing from the scope of the invention as defined by the appended claims.

What is claimed is:

1. A polishing compound of relatively high purity silicon nitride, said silicon nitride comprising particles having essentially equiaxial crystals, the particle size being from about 0.03 microns to about 5 microns.

2. A polishing compound of claim 1 wherein said silicon nitride has a purity of at least about 94%.

3. A polishing compound of claim 1 wherein a portion of said silicon nitride is alpha silicon nitride.

4. A polishing compound of claim 3 wherein essentially all of said silicon nitride is alpha silicon nitride.

* * * * *